United States Patent [19]

Matthews

[11] Patent Number: 5,385,126

[45] Date of Patent: Jan. 31, 1995

[54] ENGINE STARTING SYSTEM WITH ENERGY MANAGEMENT SUBSYSTEM

[75] Inventor: Jacob Matthews, Dearborn Heights, Mich.

[73] Assignee: Ford Motor Company, Dearborn, Mich.

[21] Appl. No.: 67,898

[22] Filed: May 27, 1993

[51] Int. Cl.⁶ .............................................. F02N 17/04
[52] U.S. Cl. ................................ 123/179.21; 307/10.7
[58] Field of Search ............ 123/179.3, 179.4, 179.21; 307/10.7, 10.6; 340/455, 636; 320/48

[56] References Cited

U.S. PATENT DOCUMENTS

| | | | |
|---|---|---|---|
| 4,658,772 | 4/1987 | Auth et al. | 123/145A |
| 4,664,088 | 5/1987 | Cantoni | 123/557 |
| 4,818,842 | 4/1989 | Walty | 123/557 |
| 4,888,716 | 12/1989 | Ueno | 340/636 |
| 4,937,528 | 6/1990 | Palanisamy | 320/48 |
| 4,944,260 | 7/1990 | Shea et al. | 123/179.21 |
| 5,050,545 | 9/1991 | Shirata et al. | 123/179.21 |
| 5,072,703 | 12/1991 | Sutton | 307/10.7 |
| 5,094,198 | 3/1992 | Trotta et al. | 123/179.21 |
| 5,109,151 | 4/1992 | Demizu et al. | 219/519 |

*Primary Examiner*—Andrew M. Dolinar
*Attorney, Agent, or Firm*—Jerome R. Drouillard; Roger L. May

[57] ABSTRACT

A system for starting an internal combustion engine includes an electrical energy storage device 10, a cranking motor 12 connected with the storage device, and energy management means including a controller 26 for estimating the energy delivery capability of the storage device as a function of at least one variable having a value determined during a previous episode of engine operation.

2 Claims, 5 Drawing Sheets

ENGINE STARTING SYSTEM WITH ENERGY MANAGEMENT SUBSYSTEM

BACKGROUND OF THE INVENTION

The present invention relates to a system for placing an internal combustion engine into a fully operational condition, beginning with a cold start. The problem of staring a cold internal combustion engine is particularly exacerbated by the starting characteristics of higher compression engines, such as diesel engines. Compression ignition engines frequently require pre and post heating of the air charge, and sometimes the fuel, in order to achieve acceptable exhaust emissions, particularly with respect to visible smoke. Such heating places an even greater burden on the starting battery.

DESCRIPTION OF HE PRIOR ART

U.S. Pat. No. 5,094,198 to Trotta et al. illustrates a system in which various engine operating parameters are sensed, as well as battery condition. In the '198 patent, battery condition is determined by measuring the instantaneous battery voltage. Unfortunately, it has been determined that such a measure is inadequate in many cases for the purposes of determining the battery energy availability. A system according to the present invention, through its use of historical battery and starter operational data, obviates problems which result from reliance upon instantaneous measurements to determine battery condition, and the present system therefore provides a more reliable means for operating the starting system of an engine.

SUMMARY OF THE INVENTION

According to the present invention, a system for starting an internal combustion engine comprises an electrical energy storage device, a cranking motor connected with the storage device, and an energy management means for estimating the energy delivery capability of the storage device as a function of at least one variable having a value determined during a previous episode of engine operation. The energy management means preferably comprises temperature sensing means for sensing the temperature of the electrical power storage device, which typically comprises a storage battery, as well as voltage sensing means for sensing the operating voltage of the storage device, and processor means, operatively connected with the temperature and voltage sensing means, for using the sensed values of temperature and voltage, as well as previously recorded values for battery charge and battery resistance and other parameters, to determine the energy delivery capability of the battery.

An energy management means according to the present invention further comprises means for calculating a starting energy value required to start the engine and means for comparing the calculated starting energy value with the estimated energy delivery capability. In the event that the estimated energy delivery capability of the battery or other energy storage device is not sufficient to perform at least one function connected with starting the engine, the operator of the engine will be notified.

A starting system according to the present invention may include as powered devices not only a cranking motor, or starter motor, but also fuel and air heaters powered by the battery or other electrical storage device. In such case, the processor will further comprise means for determining the amount of time during which the fuel heater or air heater should be operated based upon at least one sensed temperature. In the event that the power capability of the battery or other storage device is insufficient to operate a fuel or air heater, the operator will be so advised. According to yet another aspect of the present invention, a method for starting an internal combustion engine having an electric storage battery for starting power comprises the steps of sensing at least a first operating parameter related to the battery energy required to start the engine; determining whether the battery has sufficient energy output capability to start the engine based upon a sensed value of a first operating parameter, as well as upon a previously stored value of a second operating parameter; and controlling the starting sequence of the engine based upon the determined battery power output.

According to yet another aspect of the present invention, a starting system, where the energy storage device comprises a battery, the energy management means may further comprise means for determining the state of deterioration of the battery and means for notifying a human operator that the battery should be replaced.

DETAILED DESCRIPTION OF THE PREFERRED EMBODIMENTS

Figure 1:
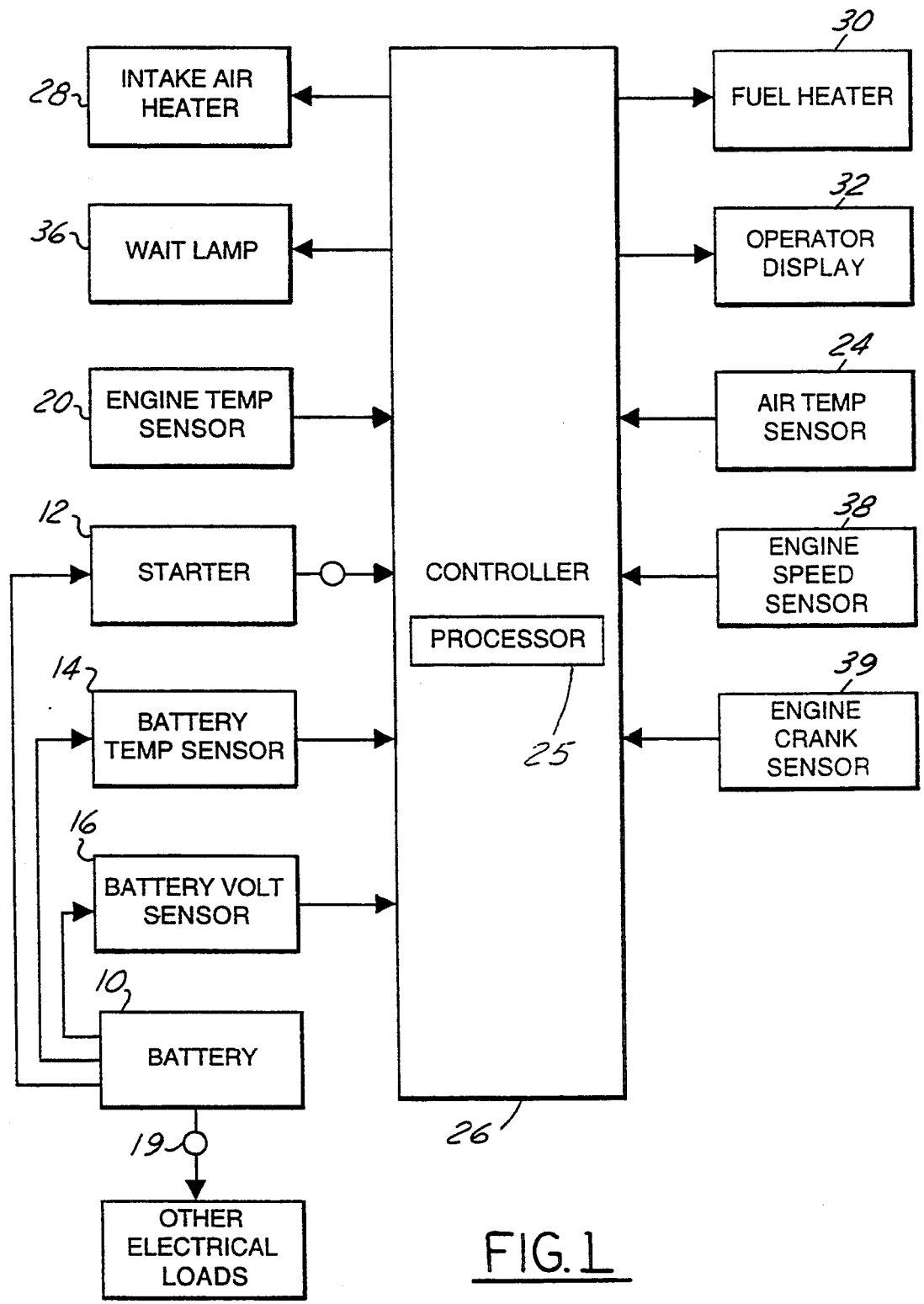
FIG. 1 is a block diagram of a starting system according to the present invention.

As shown in FIG. 1, an engine starter or cranking motor 12 is supplied with electrical power by means of battery 10. Controller 26 receives information from a variety of sensors and utilizes this information to operate several electronically powered components in the present system. Accordingly, controller 26 receives ambient air temperature information from air temperature sensor 24, engine temperature information from engine temperature sensor 20, and battery temperature and battery voltage information from sensors 14 and 16, respectively. Controller 26 also receives high discharge rate current information from starter current sensor 18, and low discharge rate current information from current sensor 19. Sensor 19 measures the current flowing to lower power consumption devices which would typically be used in a motor vehicle, such at the lighting, entertainment electronics, and other devices. Controller 26 also receives information from engine speed sensor 38 and engine crank sensor 39. Controller 26 operates air heater 28 and fuel heater 30 to assist in starting the engine without undue exhaust emissions.

Controller 26 selectively operates an operator display 32 to inform the operator of the engine as to the contemporaneous state of the starting process. For example, through display 32, the operator may be told to charge storage battery 10, to use ether for starting with or without the air and fuel heaters. Display 32 may also be used for advising the human operator in the event that battery 10 has deteriorated to a point where it should be replaced.

Controller 26 comprises not only microprocessor 25, but also various input/output devices and associated power relays known to those skilled in the art to which the present invention pertains. The precise layout for such relays and input/output devices is a matter of design choice and is not within the scope of the present invention.

Figure 2A:
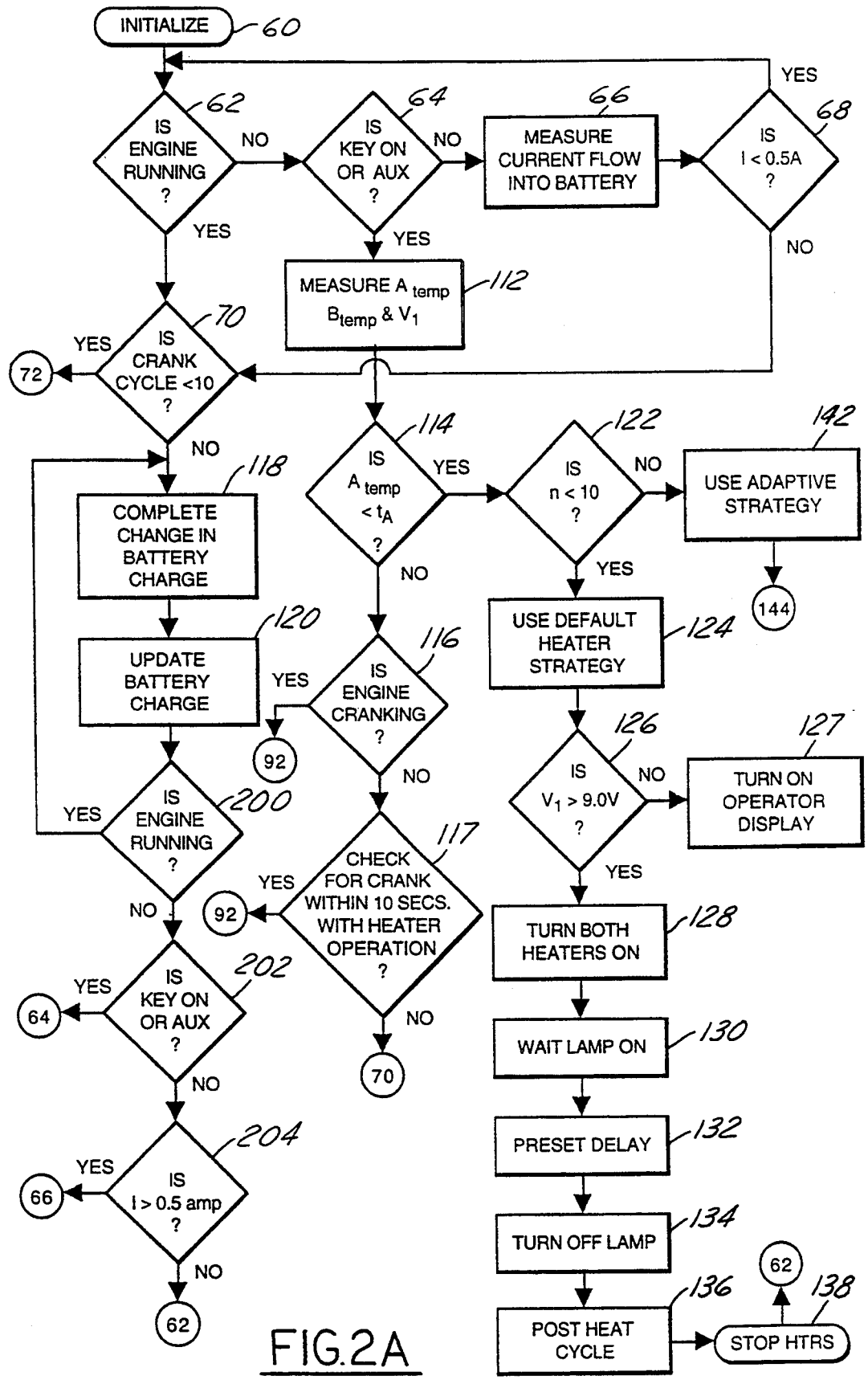
FIGS. 2A-2C are a flow chart illustrating the operation of a starting system according to the present invention.
Figure 2B:
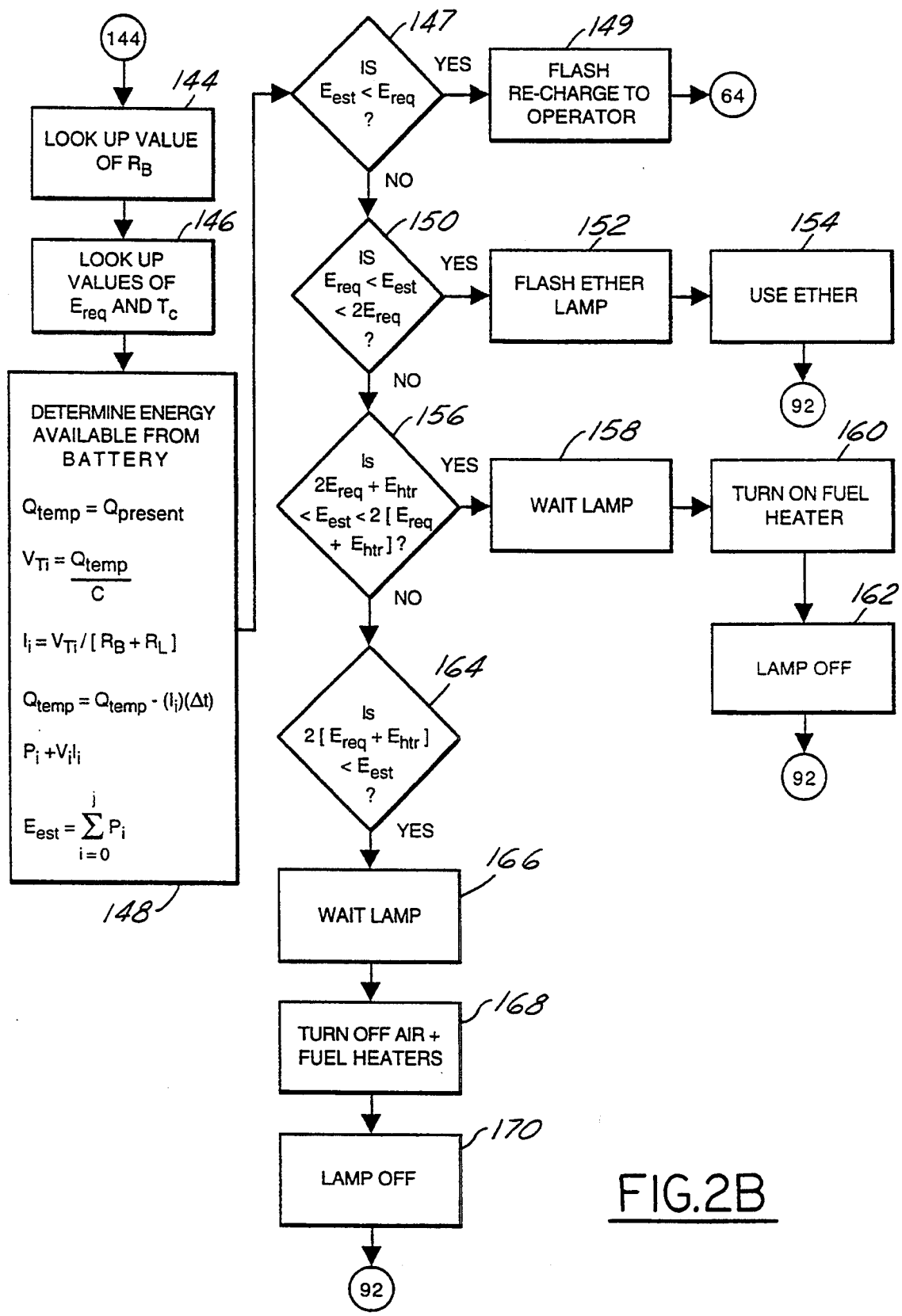
Figure 2C:
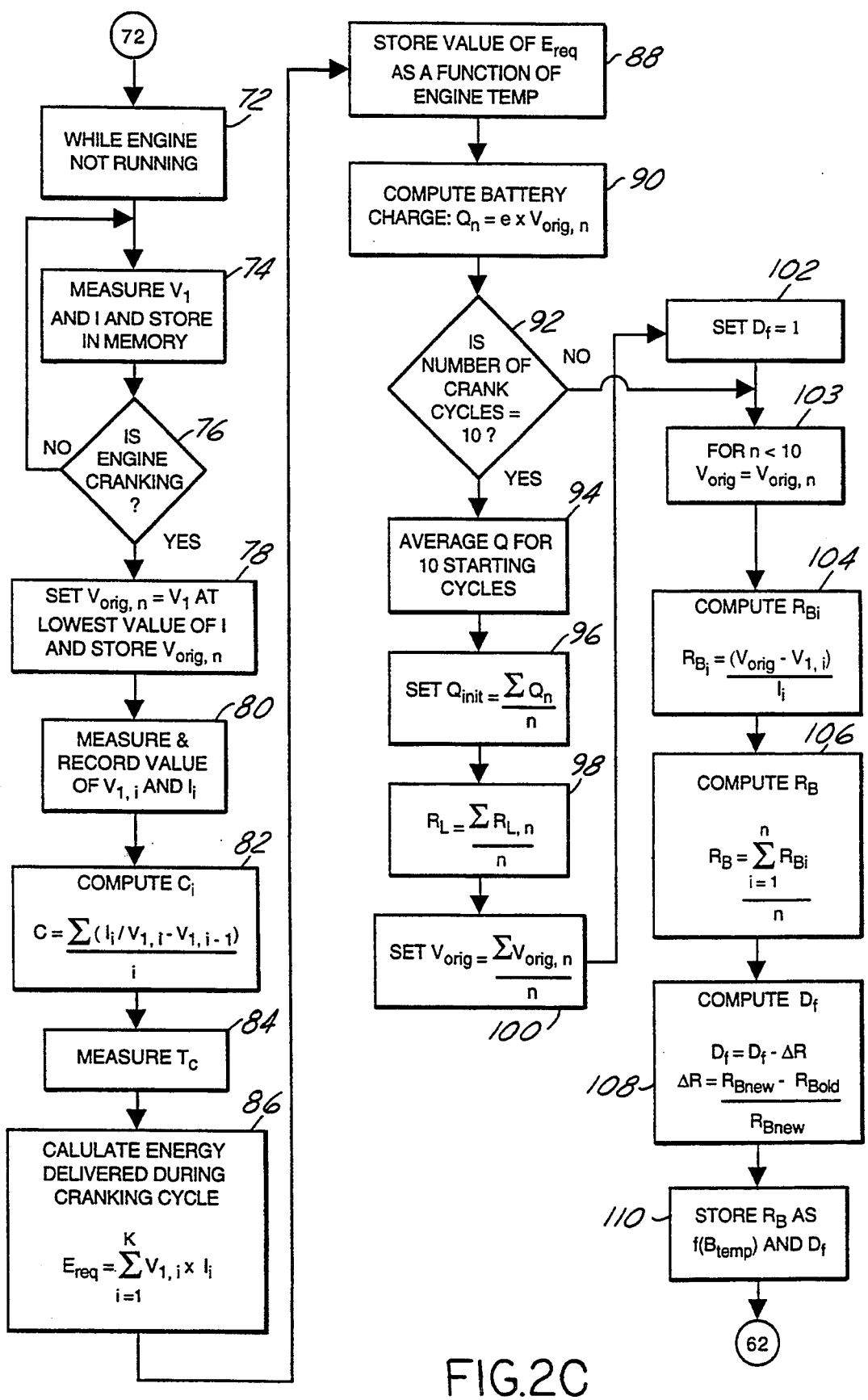

Beginning now with FIG. 2, a method for starting an engine of the present invention begins with the initialization of variables by processor 25 at block 60. Progressing to block 62, processor 25 checks whether the engine is running. If not, the processor moves to block 64, where the processor checks whether the ignition key is in the "on" or run position, or the auxiliary position, or the "off" or engine stop position. If the ignition key is in the off position, processor 25 moves to block 66, wherein the instantaneous battery current flow is measured, using sensors 18 and 19. Note that the net flow of current into the battery may be positive even when the engine is not running, if the battery is connected to an external charger.

Figure 6:
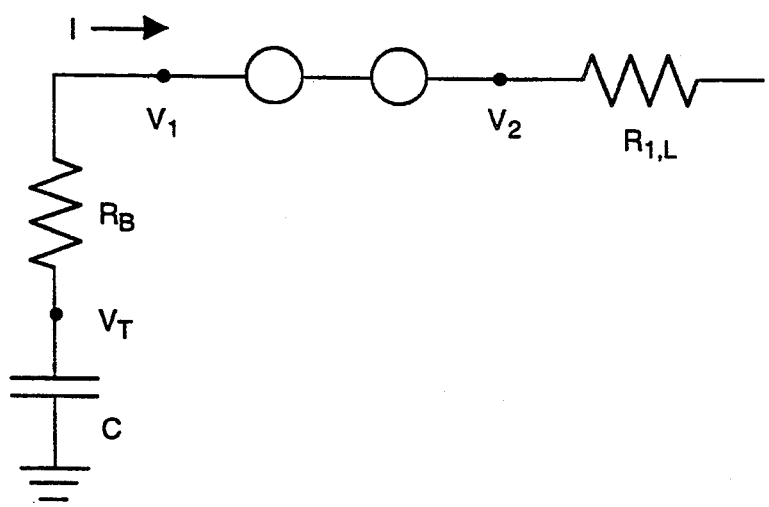
FIG. 6 is a schematic representation of portion of a battery circuit according to the present invention.

At block 68, processor 25 inquires as to the magnitude of the battery current flow. If this value is a small value, say less than approximately 0.5 amperes, the routine returns to block 62 and repeats. If the battery current flow is greater than 0.5 amperes, either as a discharge or recharge of the battery, the routine moves to block 70. At block 70, if the engine has been cranked to a start condition fewer than 10 times with the present battery, the program moves to block 74 via block 72, such that with the engine not running, the battery terminal voltage, $V_1$, and battery current flow, I, (FIG. 6) are measured and stored in the processor's memory. As shown in FIG. 6, the battery circuit includes the battery's capacitance, C, the battery's internal resistance, $R_B$, starter current sensor 18, low current sensor 19, and external load resistance, $R_L$.

After finishing with block 74, the routine moves to block 76, wherein the cranking state is assessed. If the engine is not being cranked, the routine returns to block 74 and continues to store values for $V_1$ and I. If the engine is being cranked at block 76, the routine passes to block 78, where the variable $V_{orig,n}$ is set equal to recorded value of $V_1$ corresponding to the lowest recorded value of I. Then at block 80, while the engine is cranking, a series of values for battery terminal voltage, $V_{1,i}$, and cranking current, $I_i$, are sampled and recorded. Although these values are recorded every time the engine cranked, the data from the first ten cranking cycles for a newly installed battery are used at block 82 to compute a value, C, corresponding to the capacitance of the bartery.

$$C = (\Sigma I_i/((V_{1,i} \cdot V_{1,i-1})/t))/i$$

where: t = the sampling interval, which could be one second, or faster; and i = an individual sample identifier.

Having computed C, the routine passes to block 84, where cranking time, $T_c$, is measured each time the engine is cranked. In the event that any newly measured value differs from the previously recorded value by more than ten percent, the new value of $T_c$ will be inserted along with a value corresponding to engine temperatures, as determined by sensor 20.

Figure 4:
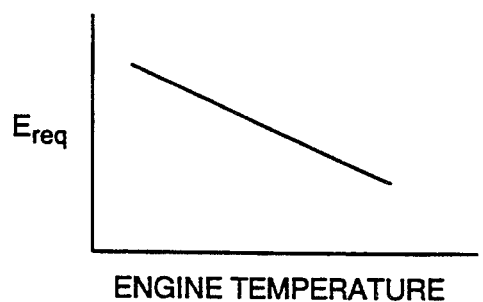
FIG. 4 is a graphical representation of a lookup table indicating the energy required to start the engine, as a function of engine temperature.

In order to advise the human operator of the battery's condition prior to the onset of cranking, it necessary to know the amount of energy required to crank. Processor 25 determines this by using a lookup table shown graphically in FIG. 4, which indicates the energy required to start the engine, $E_{req}$, as a function of engine temperature. Those skilled in the art will appreciate view of this disclosure that a system according to the present invention could be implemented through the use of additional variables, or other variables for the purpose of determining the cranking energy requirement. Similarly, each of the constants and sampling intervals would normally be selected according to the specific needs of a system according to the present invention.

At block 86, the energy delivered by the battery, and hence, the energy required during cranking, is given by the expression:

$$E_{req} = \Sigma(V_{1,i}) \times (I_i),$$

where the voltage and current are sampled at an appropriate interval, for example, one second, during cranking. At block 88 the value for $E_{req}$ and a corresponding value for engine temperature, as sensed by engine temperature sensor 20, are stored in the processor's memory if the new value for $E_{req}$ differs from the previously recorded value by more than ten percent. This is done every time the engine is started.

During the first ten crank cycles for a new battery, the charge stored in the new battery is computed at block 90, according to the expression:

$$Q_n = C \times V_{orig,n}$$

Another function performed by the present system is the calculation of battery resistance, $R_B$. At block 92, if the engine has been cranked fewer than ten times with the present battery, the routine moves to blocks 103, 104, and 106, where battery resistance is computed as follows. First, at block 103, $V_{orig}$ is set equal to $V_{orig,n}$. Then:

$$R_{Bi} = (V_{orig} - V_{1,i})/I_i$$

where $V_{1,i}$ is a sampled voltage available to the starter, $V_{orig}$ is the output voltage of a new battery, and $I_i$ is the battery discharge current.
summa $R_B = (\Sigma R_{Bi})/n$ where n samples have been taken, at a sampling interval of 1 sec., or faster.

At block 108, a value for battery deterioration factor, $D_f$, is calculated:

$$D_f = D_f - \delta R,$$

where $\delta R = (R_{Bnew} - R_{Bold})/R_{Bnew}$.

Figure 3:
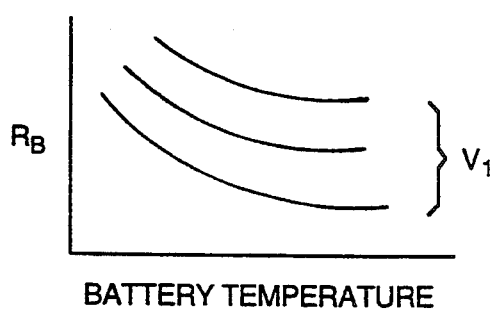
FIG. 3 is a graphical representation of a lookup table indicating battery resistance as a function of battery temperature and battery voltage.

At block 110, the value of $R_B$ is stored with accompanying values for battery temperature, $B_{temp}$, and battery voltage, $V_1$. This information is used to build a lookup table, as illustrated graphically in FIG. 3. Accordingly, the value for $R_{Bold}$ may be drawn from the lookup table illustrated by FIG. 3. The new calculated value for Df is also stored at this time.

Returning to block 92 for the moment, if the number of crank cycles is equal to ten, such that the initial performance of the battery may be ascertained reliably, processor 25 calculates an average value for battery charge, Q, at block 94, for the first ten starting cycles. Thereafter, at block 96, the value of $Q_{init}$ is set equal to the ten-cycle average of Q.

At block 98, the value of the average total load resistance, $R_L$, for electrical equipment including the starter and other devices which may be serviced by the storage battery in a vehicular engine installation, such as lighting and entertainment electronics, but not including the fuel and air heaters, is determined. Similarly, where ten cranking cycles have occurred, an average value for $V_{orig}$ is calculated at block 100. At block 102, $D_f$ is set equal to 1, an initial value.

Returning now to block 64, in the event that the ignition key is in the "on" position, air temperature, and battery temperature and voltage are measured at block 112. Then, if the air temperature is greater than a predetermined value at block 114, the routine moves to block 116, and if the engine is being cranked, the routine will move to block 92 and continue as previously explained. If the answer at block 116 is negative, and if either of heaters 28 or 30 has been activated, processor 25 will watch for a crank signal within ten seconds at block If cranking begins within ten seconds, the routine moves to block 92 and continues as before. If not, the routine moves to block 70, and continues by re-computing the charge available to start the engine. Finally, at block 116, if the engine is not being cranked, and neither of the heaters is activated, the routine will move to block 92 and continue.

Returning now to block 114, if the air temperature is less than a predetermined value, the routine moves to block 122, where the number of cranking events is once again noted. If fewer than 10 cranking events have occurred, the routine implements a default heater strategy at block 124. Thereafter, if battery voltage is greater than nine volts at block 126, the air and fuel heaters are turned on at block 128, along with a "wait lamp" at block. 130. After a preset delay has been counted down at block 132, the wait lamp is turned off at block 134 and a preset post-heat cycle is implemented at block 136. The heaters are stopped at block 138, and the routine returns at block 140 to block 62. If the measured voltage at block 126 less than 9 volts, the operator display will be activated at block 127, so as to advise the operator to use ether, or some other appropriate starting strategy.

Figure 5:
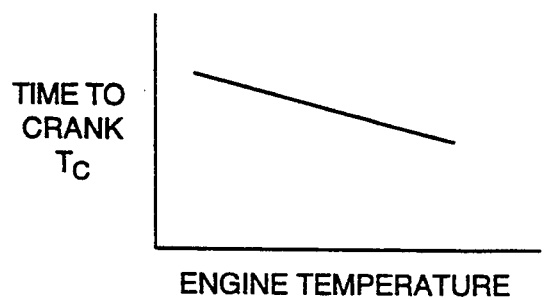
FIG. 5 is a graphical representation of a lookup table indicating the time required to crank the engine to a running condition, as a function of engine temperature.

If the number of cranking cycles is ten or greater at block 122, processor 25 moves at block 142 to the adaptive routine illustrated at blocks 144–170. Beginning at block 144, processor 25 uses the lookup table graphically illustrated in FIG. 3 to obtain a value for battery resistance, $R_B$, as a function of battery temperature and terminal voltage. Then, at block 146, the processor determines the energy, $E_{req}$, and cranking time, $T_c$, required to start the engine, from the lookup tables having the data illustrated in FIGS. 4 and 5, respectively.

At block 148, the processor determines the estimated energy, $E_{est}$, available to start the engine, by performing a stepwise iterative calculation of the produce of the battery voltage, $V_T$, and battery current, I. The iteration is stepped through for number of seconds equal to the value of $T_c$ drawn from the appropriate lookup table. Those skilled in the art will appreciate in view of this disclosure that the iterative process described herein could use not only one second time intervals, but even smaller intervals, if such intervals are indicated by the system characteristics. In any event, the calculated value of $E_{est}$ is compared with the value of $E_{req}$ drawn from a lookup table at blocks 147 et. seq. Beginning with block 147, if the value of $E_{est}$ is less than the value of $E_{req}$, processor 25 will flash a warning lamp at block 149 to advise the human operator that battery 10 should be recharged.

If the value of $E_{est}$ is greater than the value of $E_{req}$ at block 147, the routine continues to block 150. There, if the value of $E_{est}$ lies between one and two times the value of Ereq, an indicator lamp is flashed at blocks 152 and 154 to advise the operator that ether, or some other non-electrical power consuming starting aid should be used, on the assumption that the battery contains little more available energy than the minimum required to perform the entire starting sequence, including the use of the fuel and air heaters. If the answer at block 150 is in the negative, the routine moves to block 156, and if $E_{est}$ lies between the sum of twice $E_{req}$ plus $E_{htr}$, which is an average value of the energy required to operate both the air and fuel heaters, and the twice the sum of $E_{req}$ plus $E_{htr}$, the wait lamp will be turned on at block 158, along with the fuel heater at block 160. Thereafter, at block 162, the wait lamp will be turned off after an appropriate time interval, which may be either fixed, or determined by processor 25 as a function of the engine temperature, or the ambient temperature or some other appropriate engine operating variable. Then the human operator will crank the engine.

If the answer to the question posed at block 156 is negative, the processor continues to block 164. There, $E_{est}$ must be greater than twice the sum of $E_{req}$ plus $E_{htr}$ and, once again, wait lamp 36 will be turned on at block 166, and at block 168, both the fuel and air heaters will be turned on. As before, after a predetermined time period has passed, the wait lamp will be turned off at block 170 and the human operator will know to start the engine. Whenever the engine is cranked, processor 25 moves to block 92 and continues through the routine as previously explained.

Once the engine is running, the routine begins at block 70 to calculate the battery's state of charge. Thus, at block 70, if the engine has been cranked with the present battery for more than 9 times, or some other appropriate number of cranking episodes, the routine progresses to blocks 118 and 120, wherein the charge added and subtracted from battery 10 is calculated and periodically updated by integrating the battery current flow as measured with current sensors 18 and 19, as a function of time. At block 200, processor 25 checks to determine whether the engine is running, and if the answer is affirmative, the routine continues with block 118. If the engine has stopped, but the ignition key is in the on or auxiliary positions at block 202, the routine passes to block 64 to continue as previously described. If the ignition key is in the off position at block 202, the routine moves to block 204, and if the battery current is greater than 0.5 amperes, the routine moves to block 66. If the current flow is less than 0.5 amperes, the routine moves to block 62 and continues. In the event that the value of $D_f$ declines below a predetermined value, display 32 may be used to inform the human operator that battery 10 should be replaced.

I claim:

1. A system for starting an internal combustion engine, comprising:

an electrical energy storage device;

a cranking motor connected with said storage device;

an electrically powered fuel heater for warming fuel flowing to an engine, with the fuel heater being powered by said electrical energy storage device; and energy management means for estimating the energy delivery capability of said storage device as a function of at least one variable having a value determined during a previous episode of engine operation with said energy management means further comprising means for determining the amount of time during which said fuel heater should be operated, based upon at least one sensed temperature, and means for notifying the operator of the engine in the event that the estimated energy delivery capability of the energy storage device is not sufficient to operate said fuel heater for the desired time interval.

2. A system for starting an internal combustion engine, comprising:

an electrical energy storage device;

a cranking motor connected with said storage device;

an electrically powered induction air heater for warming air flowing into the cylinders of an engine, with said air heater being powered by said electrical energy storage device; and energy management means for estimating the energy delivery capability of said storage device as a function of at least one variable having a value determined during a previous episode of engine operation with said energy management means further comprising means for determining the amount of time during which said air heater should be operated, based upon at least one sensed temperature, and means for notifying the operator of the engine in the event that the energy delivery capability of the energy storage device is not sufficient to operate said induction air heater.

* * * * *